(12) United States Patent
Blank et al.

(10) Patent No.: US 12,485,554 B2
(45) Date of Patent: Dec. 2, 2025

(54) WAFER HANDLING ROBOT WITH GRAVITATIONAL FIELD SENSOR

(71) Applicant: Lam Research Corporation, Fremont, CA (US)

(72) Inventors: Richard M. Blank, San Jose, CA (US);
Marco Piccigallo, Livermore, CA (US);
Eric Chan, San Francisco, CA (US);
Arulselvam Simon Jeyapalan, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 607 days.

(21) Appl. No.: 17/755,384

(22) PCT Filed: Oct. 23, 2020

(86) PCT No.: PCT/US2020/057028
§ 371 (c)(1),
(2) Date: Apr. 27, 2022

(87) PCT Pub. No.: WO2021/086745
PCT Pub. Date: May 6, 2021

(65) Prior Publication Data
US 2022/0395986 A1    Dec. 15, 2022

Related U.S. Application Data

(60) Provisional application No. 62/929,717, filed on Nov. 1, 2019.

(51) Int. Cl.
*B25J 11/00* (2006.01)
*B25J 13/08* (2006.01)
*H01L 21/687* (2006.01)

(52) U.S. Cl.
CPC ......... *B25J 13/088* (2013.01); *B25J 11/0095* (2013.01); *H01L 21/68707* (2013.01)

(58) Field of Classification Search
CPC ...... B25J 13/088; B25J 11/0095; B25J 9/042; B25J 9/046; H01L 21/68707; H01L 21/67742; H01L 21/67766; H01L 21/68
(Continued)

(56) References Cited

U.S. PATENT DOCUMENTS 5,872,892 A * 2/1999 Brown ................... B25J 9/1615
901/14
6,155,768 A * 12/2000 Bacchi .............. H01L 21/68707
414/416.03
(Continued)

FOREIGN PATENT DOCUMENTS

CN     1951643 A     4/2007
CN   202485670 U * 10/2012
(Continued)

OTHER PUBLICATIONS

JP1999265924 Thin Film Substrate Carrier Multijoint Robot (Year: 1999).*
(Continued)

Primary Examiner — B M M Hannan
(74) Attorney, Agent, or Firm — Weaver Austin Villeneuve & Sampson LLP

(57) ABSTRACT

Disclosed are techniques and systems for automatically determining and correcting the levelness of a wafer handling robot end effector. The systems may use a tilt sensor or a gravitational field sensor which may be calibrated to the wafer handling robot. The output from the tilt sensor may be used to determine or estimate the tilt of an end effector of the wafer handling robot and to perform correctional positioning to reduce or eliminate the tilt, to automatically teach certain
(Continued)

positions that have reduced tilt, to perform health checks on the robot, provide feedback to a user, etc.

20 Claims, 10 Drawing Sheets

(58) Field of Classification Search
USPC .......................................................... 700/253
See application file for complete search history.

(56) References Cited

U.S. PATENT DOCUMENTS

| | | | |
|---|---|---|---|
| 8,137,467 | B2 | 3/2012 | Meinhold et al. |
| 8,673,080 | B2 | 3/2014 | Meinhold et al. |
| 9,476,120 | B2 | 10/2016 | Meinhold et al. |
| 10,221,484 | B2 | 3/2019 | Meinhold et al. |
| 10,424,498 | B2 | 9/2019 | Hofmeister et al. |
| 10,538,000 | B2 | 1/2020 | Hosek et al. |
| 10,569,430 | B2 | 2/2020 | Hosek et al. |
| 10,584,415 | B2 | 3/2020 | Meinhold et al. |
| 10,792,822 | B2 | 10/2020 | Hosek et al. |
| 10,800,050 | B2 | 10/2020 | Hosek et al. |
| 10,882,194 | B2 | 1/2021 | Hosek et al. |
| 2001/0011876 | A1* | 8/2001 | Saino ............... H01L 21/67745 318/568.11 |
| 2001/0020199 | A1 | 9/2001 | Bacchi et al. |
| 2002/0094265 | A1* | 7/2002 | Momoki ................. B25J 9/042 414/744.5 |
| 2003/0133780 | A1* | 7/2003 | Yokota ............. H01L 21/68707 414/744.2 |
| 2004/0052626 | A1* | 3/2004 | Oem ................. H01L 21/68707 414/680 |
| 2005/0011294 | A1* | 1/2005 | Hashimoto .............. B25J 9/042 74/490.01 |
| 2007/0001638 | A1 | 1/2007 | Gray et al. |
| 2007/0110554 | A1 | 5/2007 | Ono |
| 2010/0129940 | A1 | 5/2010 | Little |
| 2011/0076117 | A1* | 3/2011 | Iizuka ............... H01L 21/67748 414/217 |
| 2012/0321426 | A1 | 12/2012 | Tanaka et al. |
| 2013/0039726 | A1* | 2/2013 | Brodine ............ H01L 21/67742 414/744.5 |
| 2013/0195599 | A1* | 8/2013 | Furuichi .............. B25J 19/0029 414/744.5 |
| 2014/0090507 | A1* | 4/2014 | Imai ......................... B25J 9/042 74/490.05 |
| 2014/0222363 | A1* | 8/2014 | Ferran .................. G01L 27/005 702/98 |
| 2014/0324208 | A1* | 10/2014 | Miner ............... H01L 21/67259 901/27 |
| 2015/0179488 | A1* | 6/2015 | Blank ..................... H01L 21/68 414/226.04 |
| 2016/0133502 | A1 | 5/2016 | Won et al. |
| 2016/0167229 | A1* | 6/2016 | Hosek ..................... B25J 18/04 74/490.06 |
| 2016/0329227 | A1* | 11/2016 | Hashimoto ....... H01L 21/67766 |
| 2017/0040204 | A1 | 2/2017 | Kim et al. |
| 2017/0129106 | A1* | 5/2017 | Schautt ................ G05B 19/423 |
| 2019/0240831 | A1* | 8/2019 | Bonora ................ B25J 11/0095 |
| 2019/0283244 | A1* | 9/2019 | Bonora .................... B25J 13/06 |
| 2020/0075377 | A1* | 3/2020 | Wakabayashi .... H01L 21/67745 |
| 2020/0083071 | A1 | 3/2020 | Gould et al. |
| 2020/0384657 | A1 | 12/2020 | Hosek et al. |
| 2021/0252716 | A1* | 8/2021 | Fukushima ....... H01L 21/67766 |
| 2025/0029860 | A1 | 1/2025 | Blank |

FOREIGN PATENT DOCUMENTS

| | | | | |
|---|---|---|---|---|
| CN | 104124189 | A | | 10/2014 |
| CN | 105352436 | A * | 2/2016 | ........... G01B 11/005 |
| CN | 105737811 | A * | 7/2016 | |
| JP | H11265924 | A * | 9/1998 | |
| JP | 2000183128 | A | | 6/2000 |
| JP | 2009012107 | A | | 1/2009 |
| JP | 2009233788 | A | | 10/2009 |
| JP | 2011091072 | A * | 5/2011 | |
| JP | 2012192504 | A | | 10/2012 |
| JP | 2013000839 | A | | 1/2013 |
| JP | 2015178161 | A | | 10/2015 |
| JP | 2015536253 | A | | 12/2015 |
| JP | 2018129509 | A | | 8/2018 |
| KR | 100572367 | B1 * | 4/2005 | |
| KR | 20050092278 | A | | 9/2005 |
| KR | 20080054759 | A | | 6/2008 |
| KR | 20100085574 | A | | 7/2010 |
| KR | 20140128861 | A | | 11/2014 |
| WO | WO-0024053 | A1 | | 4/2000 |
| WO | WO-2015154870 | A1 * | 10/2015 | ............ B25J 9/1692 |

OTHER PUBLICATIONS

JP2011091072 Diagnosis Method of Semiconductor Wafer Conveying Device (Year: 2011).*
International Preliminary Report on Patentability dated May 12, 2022 in PCT Application No. PCT/US2020/057028.
International Search Report and Written Opinion dated Feb. 5, 2021 in PCT Application PCT/US2020/057028.
International Search Report and Written Opinion dated Mar. 16, 2023 in PCT Application No. PCT/US2022/079585.
Kuka AG product literature, "KUKA develops mobile robot for semiconductor production," Aug. 13, 2019, 5 pages.
Saber Engineering product literature, "Wafer handlingpick and place robot system," retrieved Oct. 7, 2019, 5 pages.
International Preliminary Report on Patentability and Written Opinion dated May 23, 2024 in PCT Application No. PCT/US2022/079585.
JP Office Action dated Nov. 5, 2024 in JP Application No. 2022-525260, with English Translation.
KR Office Action dated Oct. 8, 2024 in KR Application No. 10-2022-7018604 with English Translation.
TW Office Action dated Jun. 20, 2024 in TW Application No. 109137589 with English Translation.
TW Office Action dated Nov. 21, 2024 in TW Application No. 109137589 with English translation.
U.S. Appl. No. 18/708,586, inventors Blank R, filed May 8, 2024.
CN Office Action dated Jan. 10, 2025 in CN Application No. 202080077575.7, with English Translation.

* cited by examiner

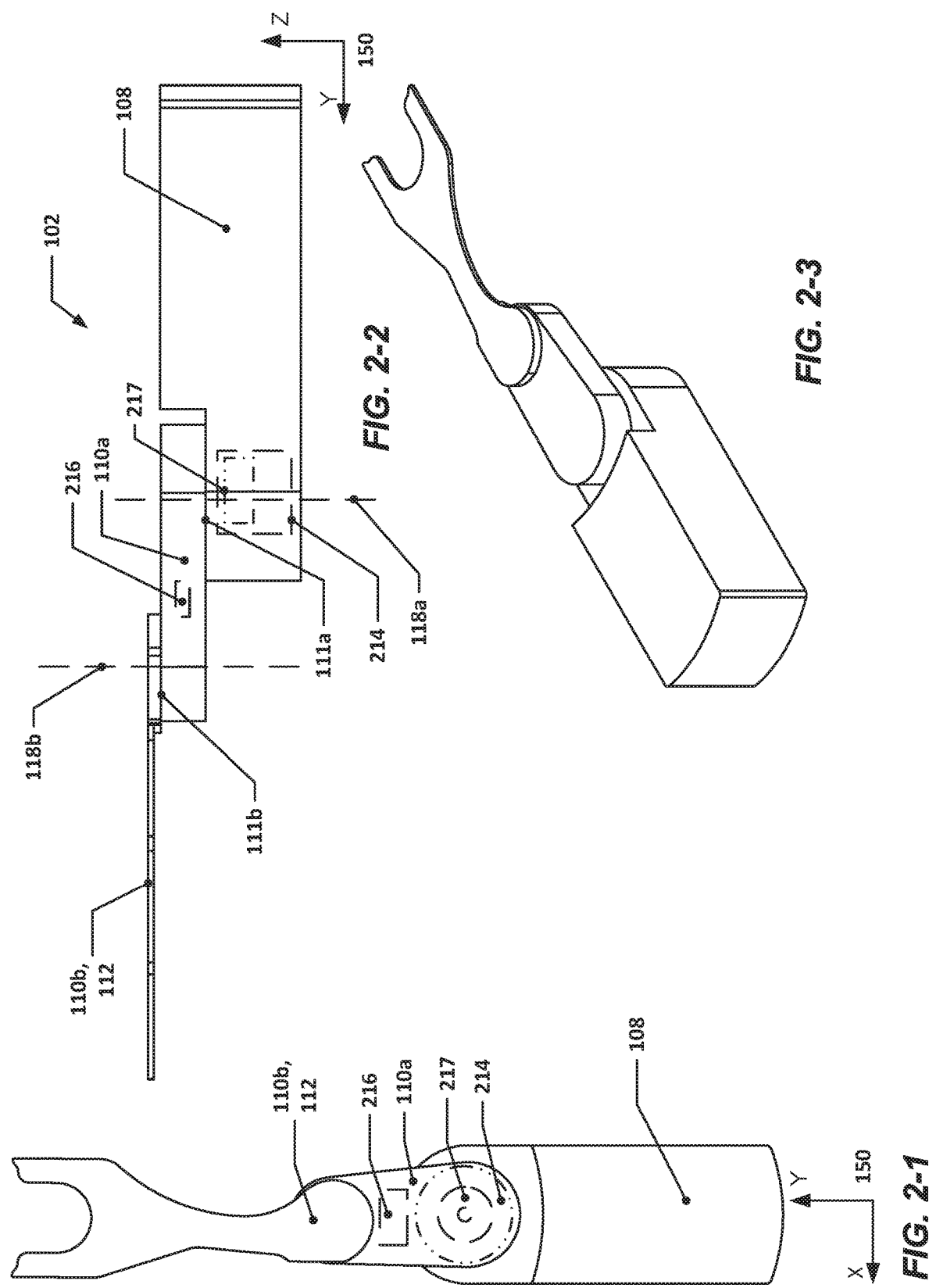

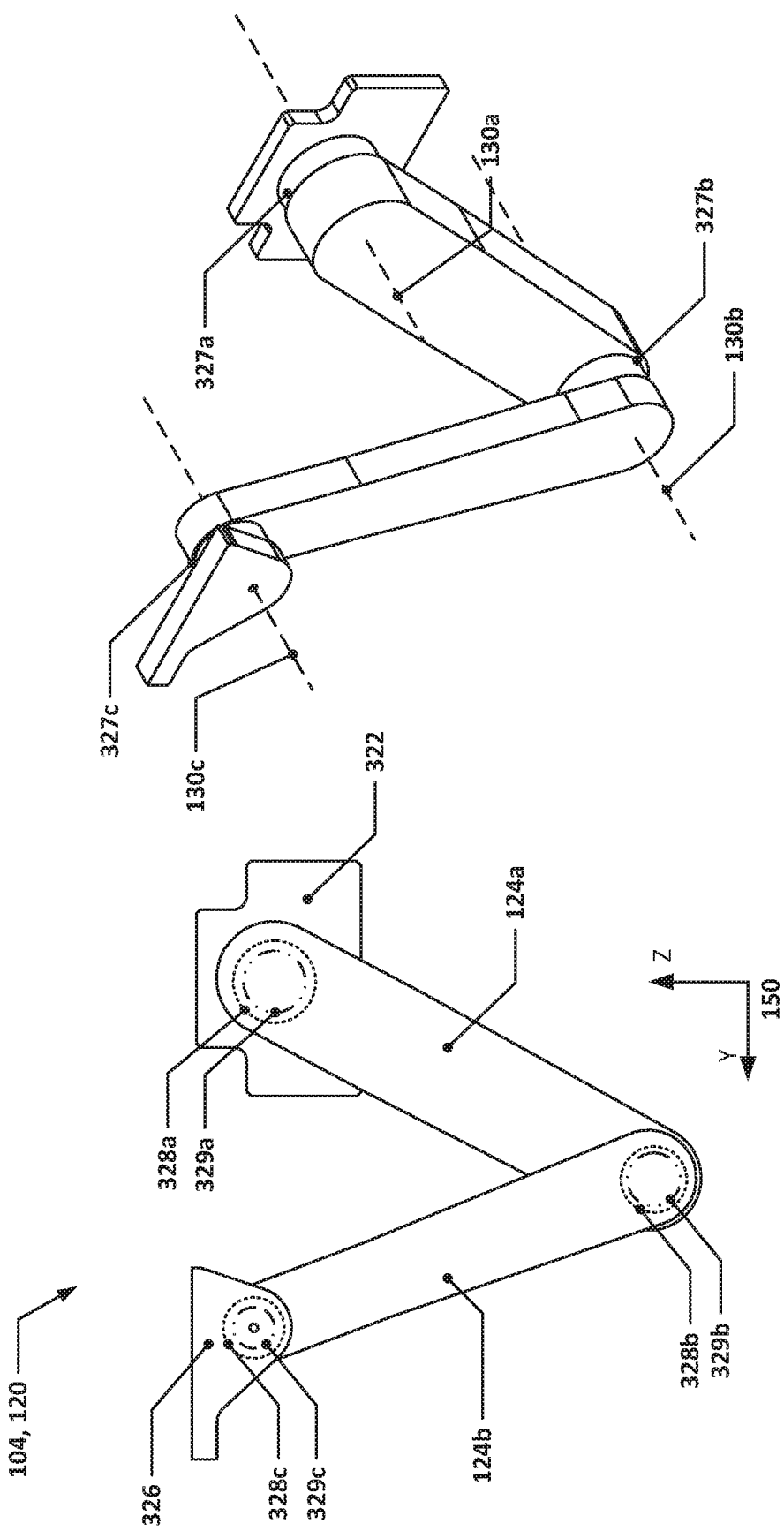

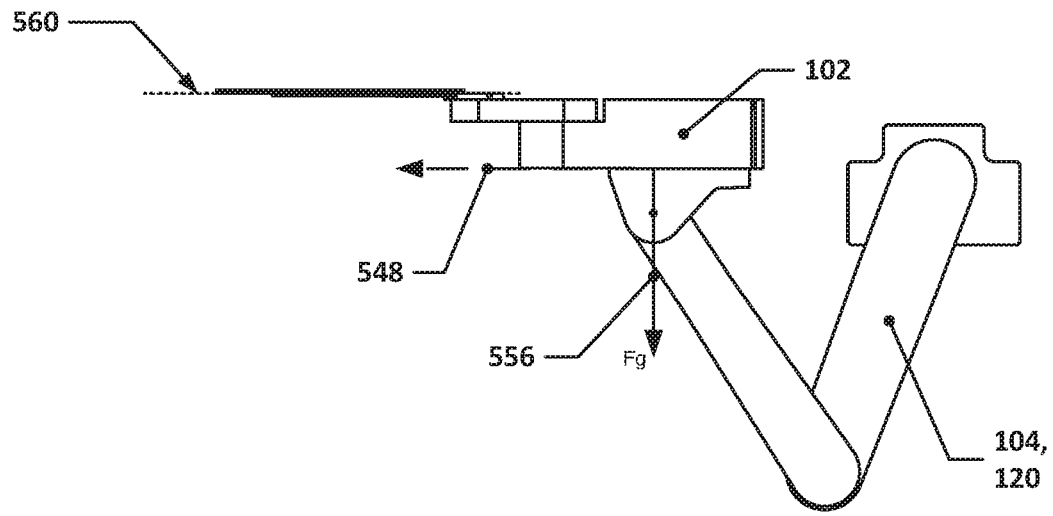
FIG. 5-1
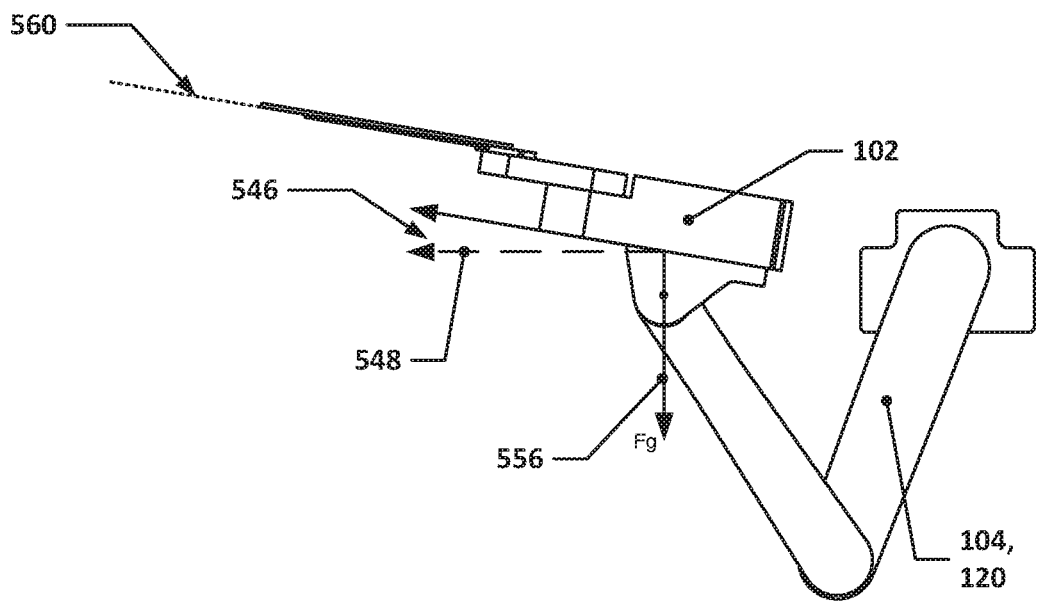
FIG. 5-2
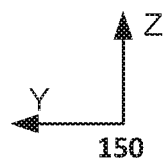

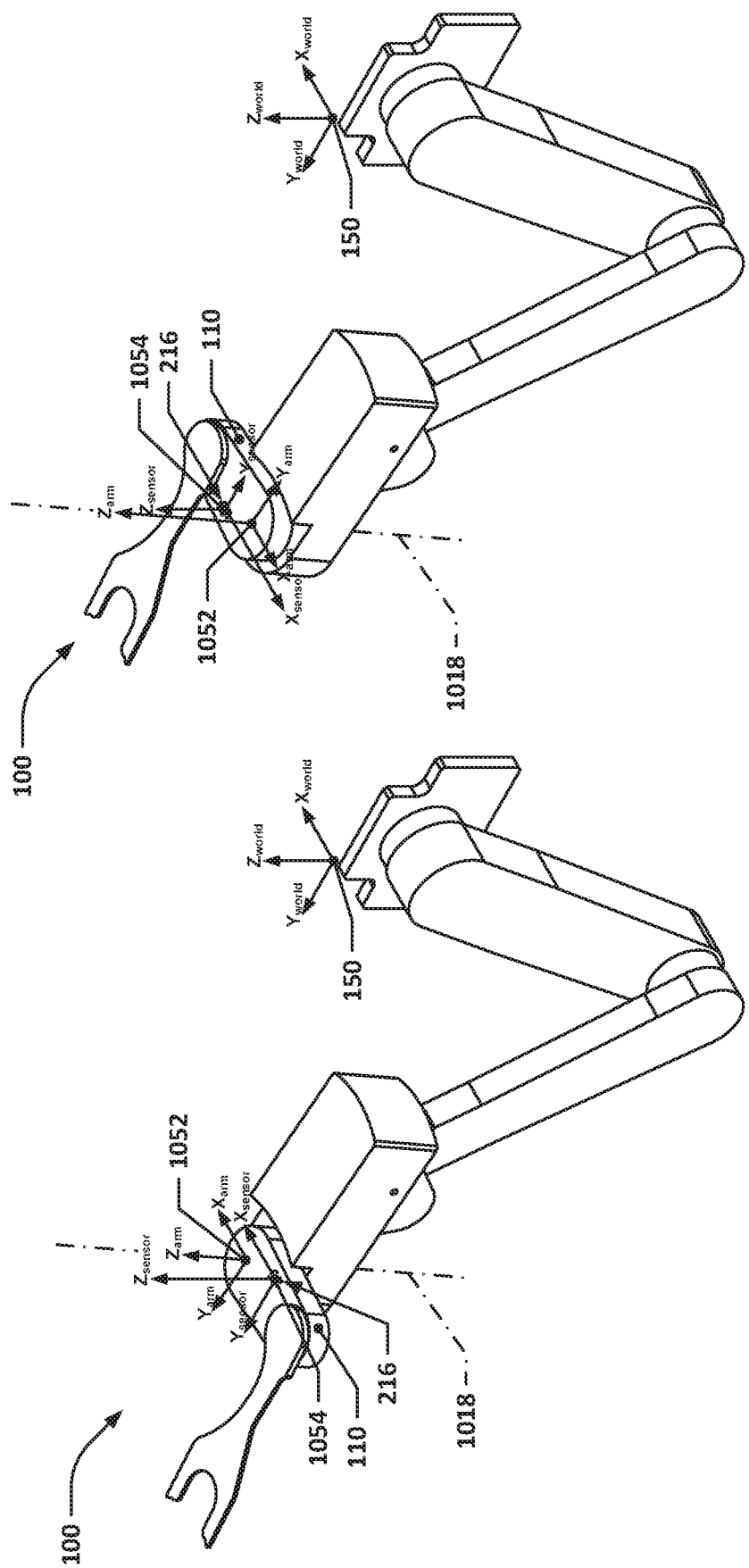

WAFER HANDLING ROBOT WITH GRAVITATIONAL FIELD SENSOR

BACKGROUND

Semiconductor processing tools typically have wafer handling robots which are used to pick wafers from a front-opening unified pod (FOUP) or wafer station, transport wafers within the processing tool, and place wafers in a FOUP or wafer station. A typical wafer handling robot includes a controller, a center base or body and robot arm links that are rotatably connected in series, with a proximal link rotatably connected to the base and a distal link being a blade-type end effector used to carry wafers. The robot arm links are driven by a drive system that includes motors, belts, and pulleys capable of rotating, extending, and retracting the robot arm links. Encoders may be used to provide positional feedback information to the controller which may then use this information to determine the position of the wafer handling robot and control the movement of the motors to place the wafer handling robot into other configurations.

SUMMARY

Details of one or more implementations of the subject matter described in this specification are set forth in the accompanying drawings and the description below. Other features, aspects, and advantages will become apparent from the description, the drawings, and the claims.

In some implementations, an apparatus may be provided that includes a first robot arm having a base, one or more first robot arm links, one or more motors, a tilt sensor, and a mechanism. One or more of the one or more first robot arm links may be an end effector which may be configured to support a semiconductor wafer, and one or more of the one or more first robot arm links may have an end rotatably connected to the base. The tilt sensor may be a gravitational field sensor configured to detect orientation relative to the Earth's gravitational field and may be fixedly mounted to one of the one or more first robot arm links or the base. The mechanism may support the first robot arm and mechanism may be configured to pivot the first robot arm about a horizontal pitch axis in response to one or more inputs.

In some implementations of the apparatus, the mechanism may include a gimbal that is configured to support the base of the first robot arm.

In some implementations of the apparatus, the mechanism may be a second robot arm. The second robot arm may have one or more second robot arm links and one or more second robot arm rotational joints. The one or more second robot arm rotational joints may each have a horizontal axis of rotation, each second robot arm link may be rotatably connected with at least one of the other second robot arm links by one of the one or more second robot arm rotational joints, and the second robot arm may be configured to support the base of the first robot arm.

In some implementations of the apparatus, the tilt sensor may be an accelerometer.

In some implementations of the apparatus, the tilt sensor may be inclinometer.

In some implementations of the apparatus, the tilt sensor may be fixedly mounted with respect to the base.

In some implementations of the apparatus, the tilt sensor may be fixedly mounted with respect to an instrumented first robot arm link of the one or more first robot arm links.

In some implementations of the apparatus, there may be two or more first robot arm links and the instrumented first robot arm link may be the first robot arm link that supports, directly or indirectly, each of the one or more other first robot arm links.

In some implementations of the apparatus, the instrumented first robot arm link may be one of the one or more end effectors.

In some implementations of the apparatus, there may be three or more first robot arm links, the three or more first robot arm links may include a proximal first robot arm link, a distal first robot arm link, and the instrumented first robot arm link, and the instrumented first robot arm link may be rotatably connected with the proximal first robot arm link by a proximal first robot arm rotational joint at a first end and with the distal first robot arm link by a distal first robot arm rotational joint at a second end opposite the first end.

In some implementations, the apparatus may include a controller having one or more processors and one or more memory devices. The one or more processors and the one or more memory devices may be operatively connected, the one or more processors may be communicatively connected with the tilt sensor, and the one or more memory devices may store computer-executable instructions that, when executed by the one or more processors, may cause the one or more processors to: receive first sensor data generated by the tilt sensor while the instrumented first robot arm link is at a first angular position relative to the base; cause the instrumented first robot arm link to rotate to a second angular position relative to the base; receive second sensor data generated by the tilt sensor while the instrumented first robot arm link is at the second angular position; and determine, based on the first sensor data and the second sensor data, calibration data for the tilt sensor.

In some implementations of the apparatus the second angular position may be 180° from the first angular position.

In some implementations of the apparatus, the one or more memory devices may store additional instructions that, when executed, may cause the one or more processors to: cause at least one of the one or more end effectors to be moved to a location associated with a wafer station; receive sensor data generated by the tilt sensor while the at least one end effector is at the location associated with the wafer station; determine, based on the sensor data generated by the tilt sensor while the at least one end effector is at the location associated with the wafer station, a pitch angle of the tilt sensor; compare the pitch angle of the tilt sensor to a threshold pitch angle range; cause, if the pitch angle of the tilt sensor is outside of the threshold pitch angle range, the mechanism to pivot about a horizontal pivot axis so that the pitch angle of the tilt sensor is within the threshold pitch angle range; and store, in at least one memory device of the one or more memory devices, a teaching position of the mechanism and the first robot arm in association with the wafer station, wherein the teaching position is indicative of the positioning of the mechanism and the first robot arm while the at least one end effector is at the location associated with the wafer station and the pitch angle of the tilt sensor is within the threshold pitch angle range.

In some implementations of the apparatus, the one or more memory devices may further store additional instructions that, when executed, may cause the one or more processors to cause the mechanism and the first robot arm to move to the teaching position when the first robot arm is caused to place a wafer at the wafer station.

In some implementations of the apparatus, the one or more memory devices may store additional instructions that, when executed, may cause the one or more processors to: cause at least one of the one or more end effectors to be moved to a location associated with a wafer station; receive sensor data generated by the tilt sensor while the at least one end effector is at the location associated with the wafer station; determine, based on the sensor data generated by the tilt sensor while the at least one end effector is at the location associated with the wafer station, a pitch angle of the tilt sensor and a roll angle of the tilt sensor; compare the pitch angle of the tilt sensor to a threshold pitch angle range; cause, if the pitch angle of the tilt sensor is outside of the threshold pitch angle range, the mechanism to pivot about a horizontal pivot axis so that the pitch angle of the tilt sensor is within the threshold pitch angle range; compare the roll angle of the tilt sensor to a threshold roll angle range; cause, if the roll angle of the tilt sensor is outside of the threshold roll angle range, the mechanism to pivot about a horizontal pivot axis so that the roll angle of the tilt sensor is within the threshold roll angle range; and store, in at least one memory device of the one or more memory devices, a teaching position of the mechanism and the first robot arm in association with the wafer station, wherein the teaching position is indicative of the positioning of the mechanism and the first robot arm while the at least one end effector is at the location associated with the wafer station, the pitch angle of the tilt sensor is within the threshold pitch angle range, and the roll angle of the tilt sensor is within the threshold roll angle range.

In some implementations of the apparatus, the one or more memory devices may store additional instructions that, when executed, may cause the one or more processors to: cause at least one of the one or more end effectors to be moved to a location associated with a wafer station; receive sensor data generated by the tilt sensor while the at least one end effector is at the location associated with the wafer station; determine, based on the sensor data generated by the tilt sensor while the at least one end effector is at the location associated with the wafer station, a roll angle of the tilt sensor; and cause an indication of the roll angle of the tilt sensor to be presented.

In some implementations of the apparatus, the one or more memory devices may store additional instructions that, when executed, may cause the one or more processors to: cause at least one end effector of the one or more end effectors to retrieve, and support, a wafer; cause the at least one end effector and the wafer supported thereby to be moved to a location associated with a wafer station; receive sensor data generated by the tilt sensor while the at least one end effector and the wafer supported thereby are at the location associated with the wafer station; determine, based on the sensor data generated by the tilt sensor while the at least one end effector is at the location associated with the wafer station, a pitch angle of the tilt sensor; compare the pitch angle of the tilt sensor to a threshold pitch angle range; cause, if the pitch angle of the tilt sensor is outside of the threshold pitch angle range, the mechanism to pivot the first robot arm about a horizontal pivot axis so that the pitch angle of the tilt sensor is within the threshold pitch angle range; and cause the first robot arm to move the at least one end effector to place the wafer in the wafer station after the pitch angle of the tilt sensor is within the threshold pitch angle range.

In some implementations of the apparatus, the one or more memory devices may store additional instructions that, when executed, may cause the one or more processors to: cause at least one end effector of the one or more end effectors to retrieve, and support, a wafer; cause the at least one end effector and the wafer supported thereby to be moved to a location associated with a wafer station; receive sensor data generated by the tilt sensor while the at least one end effector and the wafer supported thereby are at the location associated with the wafer station; determine, based on the sensor data generated by the tilt sensor while the at least one end effector is at the location associated with the wafer station, a pitch angle of the tilt sensor and a roll angle of the tilt sensor; compare the pitch angle of the tilt sensor to a threshold pitch angle range; cause, if the pitch angle of the tilt sensor is outside of the threshold pitch angle range, the mechanism to pivot the first robot arm about a horizontal pivot axis so that the pitch angle of the tilt sensor is within the threshold pitch angle range; compare the roll angle of the tilt sensor to a threshold roll angle range; cause, if the roll angle of the tilt sensor is outside of the threshold roll angle range, the mechanism to pivot the first robot arm about a horizontal pivot axis so that the roll angle of the tilt sensor is within the threshold roll angle range; and cause the first robot arm to move the at least one end effector to place the wafer in the wafer station after the pitch angle of the tilt sensor is within the threshold pitch angle range.

These and other features of the disclosed embodiments will be described in detail below with reference to the associated drawings.

BRIEF DESCRIPTION OF DRAWINGS

The various implementations disclosed herein are illustrated by way of example, and not by way of limitation, in the figures of the accompanying drawings, in which like reference numerals refer to similar elements.

FIGS. 2-1 through 2-3 depict various views of a wafer handling robot arm.

FIGS. 3-1 and 3-2 depict two views of a lower robot arm.

FIGS. 5-1 and 5-2 depict side views of a wafer handling robot in two different positions.

FIGS. 8-1 through 8-3 depict various views of a wafer handling robot arm during different stages of a calibration process.

FIGS. 10-1 and 10-2 depict views of a wafer handling robot during a calibration process.

Figure 1:
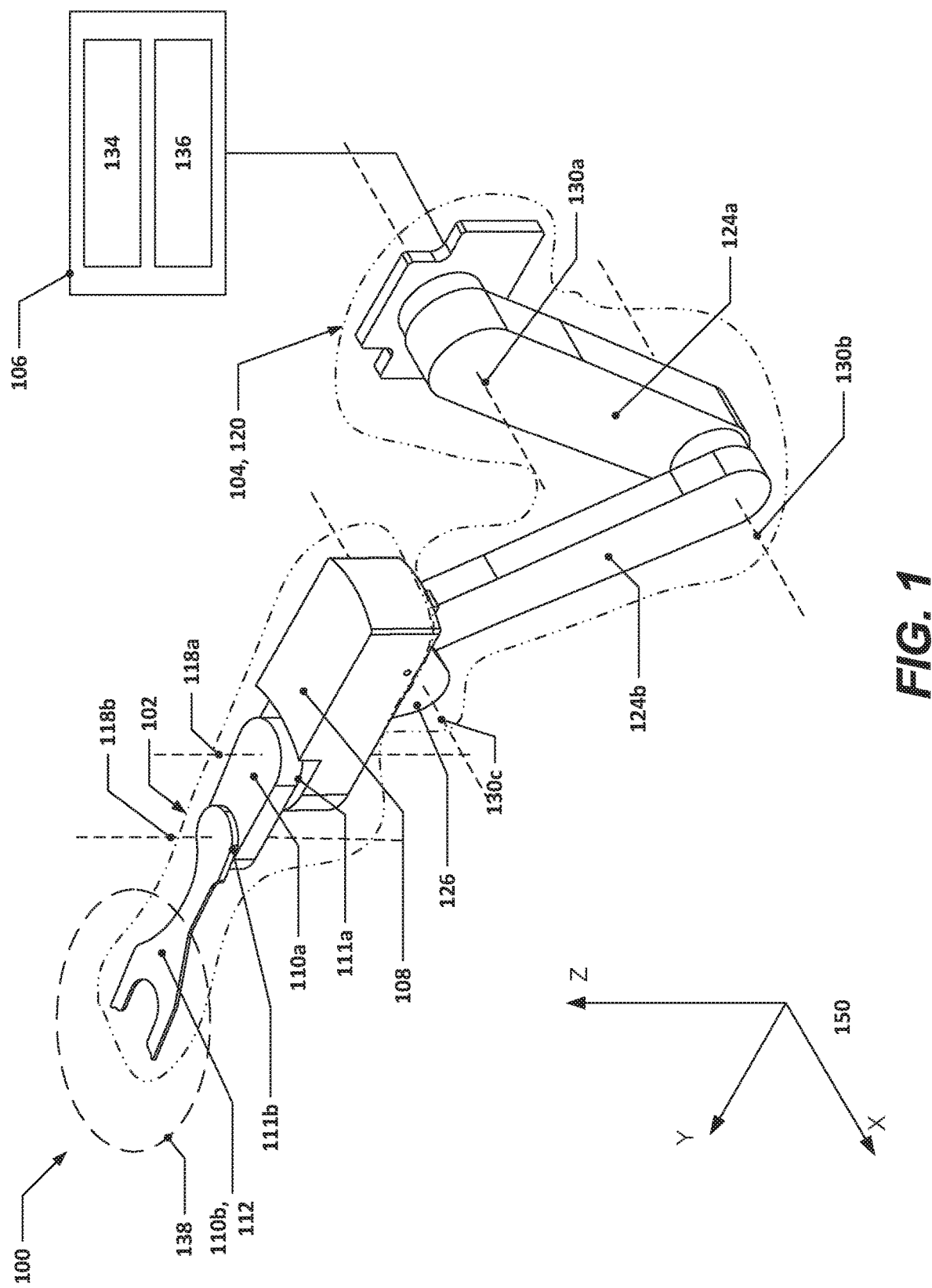
FIG. 1 depicts an embodiment of a wafer handling robot having pitch capability.

The Figures depict only an example of the concepts discussed herein, and it will be readily appreciated that the concepts discussed herein may be implemented in a large number of alternate implementations, all of which are considered to be within the scope of this disclosure.

DETAILED DESCRIPTION

In the following description, numerous specific details are set forth to provide a thorough understanding of the presented embodiments. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments.

Wafer handling robots are used to transport wafers during semiconductor manufacturing processes. Wafer handling robots must move with precision to transport wafers from one processing step to the next, and often have a control system that utilizes kinematic models in conjunction with sensor measurements and motor control systems in order to provide such precise placement. When determining the next movement of the wafer handling robot to a desired position, the controller may use feedback from one or more encoders. The kinematic models may allow the controller to use the encoder feedback to determine a position and orientation of any given robot arm link, for example, the position and orientation of an end effector. Given the current position and orientation of a given robot arm link and the position desired, the kinematic model may be used to determine how much rotational input must be provided by the motor(s) to move the given wafer handling robot arm link from the original position and orientation to the new position and orientation. The controller may cause the motor(s) to rotate by the rotational input(s) determined and drive the given wafer handling robot arm link to a desired position. During such movement, the encoder may continue to give feedback to the controller, thereby providing a closed-loop system that allows the controller to continuously modify the operation of the motors to achieve the desired placement. For example, if the wafer handling robot arm link is not at the desired position, the controller may use the kinematic model to determine the additional rotational input needed by the motor to drive the given wafer handling robot arm link to the desired position and may then cause the motor to move the additional rotational input to drive the wafer handling robot arm link to the desired position. The controller may then check the encoder to determine the position of the wafer handling robot arm link after the motor drives the robot arm link. If the robot arm link is not in the desired position, the process may be repeated until the given robot arm link is moved to the desired position.

Wafer handling robot arms are typically designed to utilize a minimal number of wafer handling robot arm links needed to perform the required motions. Minimizing the number of wafer handling robot arm links simplifies designs, reduces problems, and reduces costs. Designs become simpler in wafer handling robots when there are fewer wafer handling robot arm links because there are less parts required for the wafer handling robot and more space to fit the parts that are still required. Equally as important as simplifying design, the reduction in wafer handling robot arm links also reduces tolerance issues, such as mechanical stack-up and deflection issues, for the wafer handling robot. Wafer handling robots may have a mechanical stack-up tolerance budget and each individual wafer handling robot arm link that is added may reduce the available tolerance to other parts, including other wafer handling robot arm links. The more wafer handling robot arm links, the more precise each individual wafer handling robot arm link must be to meet a specific overall target tolerance. If the mechanical stack-up of wafer handling robot arm links exceeds the tolerance budget, there is a higher likelihood of problems. These problems may include a higher likelihood of components grinding, more and/or faster wear on components, and/or increased force on components and additional deflection of components, among other issues. Another problem with wafer handling robot arms that have a large number of wafer handling robot arm links is the potential deflection of the wafer handling robot arm. When a wafer handling robot arm is in a fully extended position, the wafer handling robot arm links may act as a cantilever, and thus each additional link added to the wafer handling robot may increase the deflection because of the force added by each wafer handling robot arm link and/or slop in the assembly of the wafer handling robot arm link to the wafer handling robot. The deflection may cause an end effector to be at an unexpected height or angle, potentially leading to the end effector or wafer crashing, i.e., colliding with another piece of equipment, while in use. To prevent or mitigate these problems, when larger numbers of robot arm links are used, each robot arm link may be designed to tighter tolerances, but this leads to an increased cost per individual robot arm link. The increased cost per individual robot arm link combined with the cost of buying a larger number of links may increase the cost of a wafer handling robot with a larger number of robot arm links dramatically compared to similar robots with a lower number of robot arm links. Thus, wafer handling robots tend to be designed to have a reduced number of robot arm links and rotational joints, as every such additional rotational joint and robot arm link may increase complexity, potential problems, and cost in the wafer handling robot arm.

FIG. 1 depicts an embodiment of wafer handling robot 100 that differs from standard wafer handling robots that typically have a reduced number of links and that constrain rotational movement of robot components to rotation about vertical axes (thus keeping the end effector(s) and robot arm links generally horizontal and reducing or minimizing the number of rotational joints that may contribute to a reduction in precision for such wafer handling robots). The wafer handling robot 100 may have a wafer handling robot arm 102, which may sometimes be referred to herein as an upper robot, and a mechanism 104 which are communicatively connected with a controller 106; the wafer handling robot arm may be mounted to the mechanism 104 such that the mechanism 104 may, at the least, impart an amount of rotation to the wafer handling robot arm about one or more horizontal axes when the mechanism 104 is actuated. In this example, the mechanism is, itself, another robot arm, as will be discussed later below, although in other implementations, the mechanism may take other forms, e.g., a gimbal mount.

As can be seen in FIG. 1, the wafer handling robot arm 102 has a base 108 which may be connected to, and supported by, the mechanism 104. As depicted in FIG. 1, the wafer handling robot arm 102 has two wafer handling robot arm links, 110a and 110b. The first wafer handling robot arm link 110a is rotatably connected to the base 108 by a rotational joint 111a that allows the first wafer handling robot arm link 110a to be rotatable around the axis 118a. The second wafer handling robot arm link 110b is rotatably connected to the first wafer handling robot arm link 110a by a second rotational joint 111b such that it is rotatable around the axis 118b. As depicted in FIG. 1, the second wafer handling robot arm link 110b may be an end effector 112 which may be used to transport a wafer 138. It will be understood that the wafer handling robot arm 102 may include a different number of robot arm links than those shown, including, for example, multiple robot arm links connected to rotational joints that are configured to rotate about a common axis (for example, there may be two second wafer handling robot arm links 110b, both rotatably connected to the wafer handling robot arm link 110a by a corresponding rotational joint 111b, e.g., to provide dual end effectors 112); the example provided is for illustrative purposes only.

Figures 2, 8:
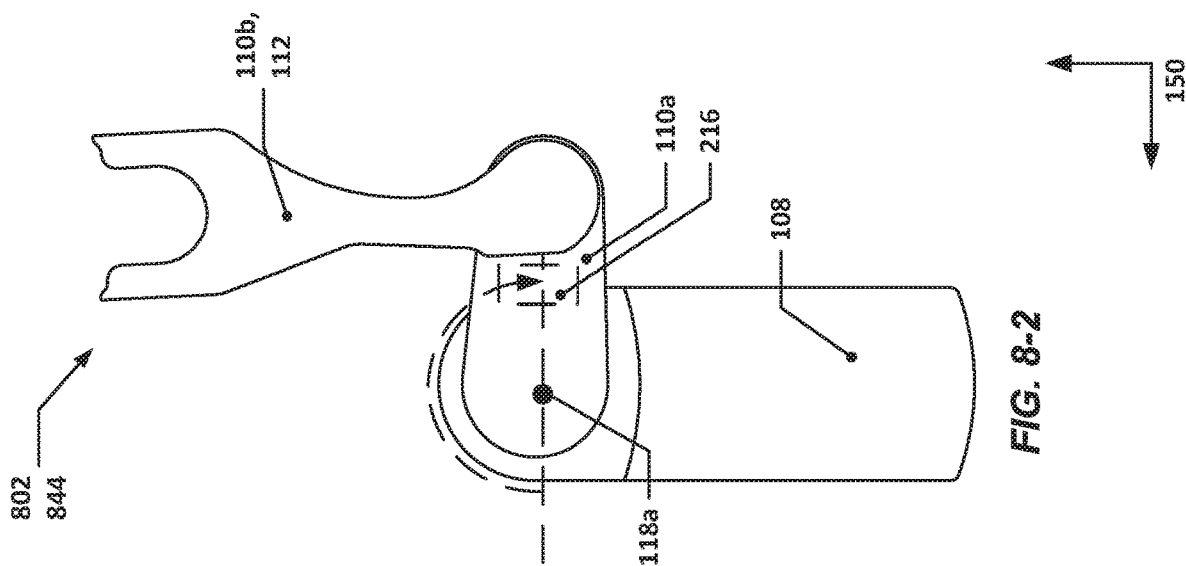
Figures 1, 8:
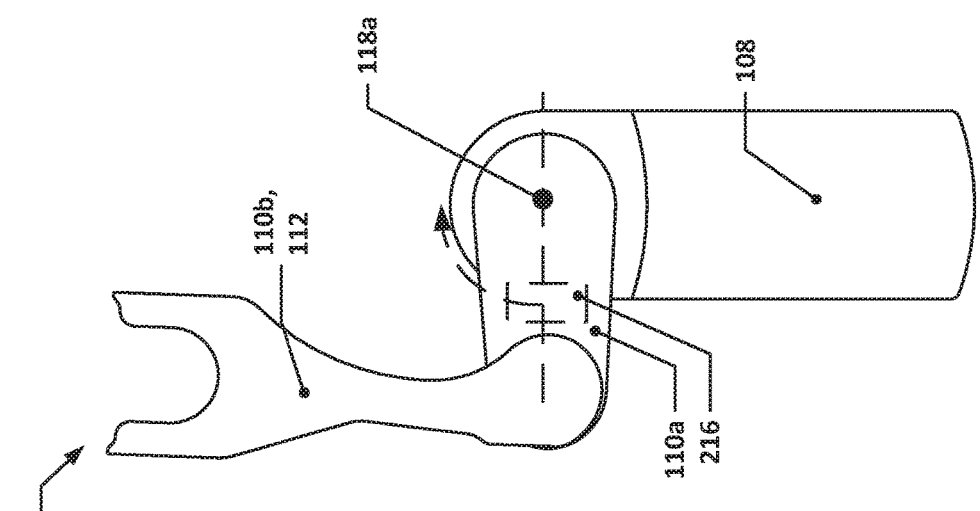

The wafer handling robot arm 102 has at least one wafer handling robot arm link 110. In some implementations, there may be a single wafer handling robot arm link which may also serve as an end effector. In other implementations, as shown in FIG. 2-1, there may be multiple wafer handling robot arm links, e.g., 110a and 110b. In such implementations, at least one of the wafer handling robot arm links is an end effector 112.

Figures 3, 8:
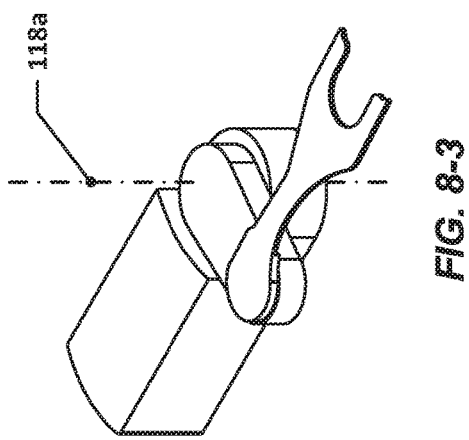

FIG. 2-1 depicts a top view of the wafer handling robot arm 102; FIGS. 2-2 and 2-3 depict, respectively, a side view and an isometric view of the same wafer handling robot arm 102. The wafer handling robot arm 102 has a motor 214 that may be controlled to drive motion of the wafer handling robot arm. In some embodiments, there may be more than one motor. In FIG. 2, the motor 214 is fixedly mounted with respect to the base 108. The motor may be fixedly mounted with respect to the base 108, in the wafer handling robot arm links 110, in a rotational joint 111, or elsewhere within the wafer handling robot arm (in particular, in more complex robot arms with multiple motors, there may be one or more motors fixedly mounted with respect to one of the robot arm links).

The wafer handling robot arm 102 may have an encoder 217. In FIG. 2, the encoder 217 is located in the first wafer handling robot arm link 110a near the rotational joint 111. Rotational encoders, such as encoder 217, typically include a sensor head and an encoder disc or similar encoder fiducial, each of which are mounted to a different one of two parts that are rotatably connected to each other. In some implementations, the encoder may be located within the motor housing. In some implementations, either the sensor head or encoder disc may be fixed mounted with respect to the base while the other part may be fixedly mounted with respect to the first wafer handling robot arm link 110a. In some implementations, there may be a single encoder used in the wafer handling robot arm 102. In other implementations, however, there may be multiple encoders used in the wafer handling robot arm 102, e.g., one for at least each rotational input source (e.g., motor). Encoders may be used to provide feedback on the position of the wafer handling robot arm 102, multiple wafer handling robot arm links 110, or a single wafer handling robot arm link to the controller.

In contrast to conventional wafer handling robots, the wafer handling robot arm 102 also includes a tilt sensor 216. In some implementations, as shown in FIG. 2-2, the tilt sensor 216 may be fixedly mounted with respect to the wafer handling robot arm link 110 connected to the base 108. In some other implementations, however, the tilt sensor may be fixedly mounted with respect to the base 108. In some implementations, the tilt sensor may be fixedly mounted with respect to the end effector 112. When a wafer handling robot has more than two links (not shown), the tilt sensor may be fixedly mounted with respect to the base or any one of the links, including the link connected to the base, the end effector link, or a link between the link connected to the base and the end effector link (the arm link to which the tilt sensor may be fixedly mounted may be referred to herein as the "instrumented link" or "instrumented arm link"). The tilt sensor 216 may also alternatively be placed in or on the base 108; generally speaking, in at least most implementations, the tilt sensor may be fixedly mounted with respect to any component of the arm system that is not configured to be able to rotate about a horizontal axis relative to an adjacent component while a wafer is supported by an end effector of the wafer handling robot in a horizontal orientation, i.e., with the major plane of the wafer being horizontal.

Figure 4:
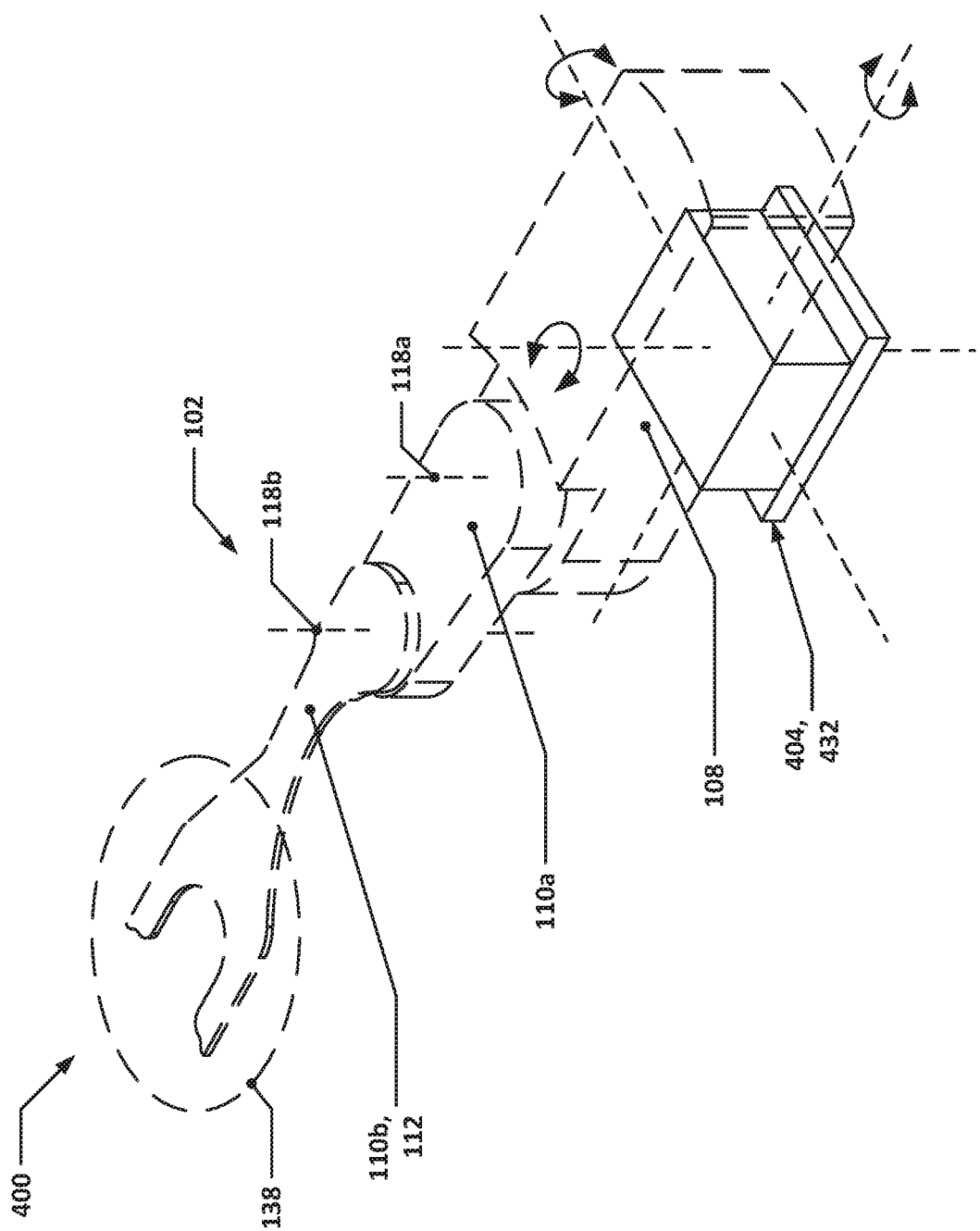
FIG. 4 depicts a wafer handling robot having a gimbal mechanism.

FIG. 1 shows a mechanism 104 connected to the wafer handling robot arm 102. The mechanism 104 shown in FIG. 1 is a lower robot arm 120. In other implementations, however, the mechanism 104 may be replaced by a mechanism with a gimbal or other tilt-enabled mount, e.g., as depicted in FIG. 4 (discussed later). Returning to FIG. 1, the wafer handling robot arm 102 may be attached to, and supported by, the lower robot arm 120. In the implementation shown, the base 108 of the wafer handling robot arm 102 is attached to a lower robot wrist mount 126. Such a configuration may allow the lower robot arm to move the wafer handling robot arm to a large number of possible positions along a linear axis, thereby allowing the wafer handling robot arm to be used to move wafers into and out of semiconductor processing chambers positioned at locations along an elongate wafer transfer chamber.

FIGS. 3-1 and 3-2 depict a lower robot arm 120 unattached to the wafer handling robot arm. As shown in FIGS. 3-1 and 3-2, the lower robot arm 120 has a base plate 322. A rotational joint 327a may connect the base plate 322 and the first lower robot arm link 124a. The rotational joint 327a allows the first lower robot arm link 124a to rotate around a horizontal axis 130a. In some implementations, a second rotational joint 327b may connect the first lower robot arm link 124a and a second lower robot arm link 124b. In such implementations, the second lower robot arm link 124b is able to rotate about a horizontal axis 130b. In some implementations, a wrist rotational joint 327c may connect the second lower robot arm link 124b and the wrist mount 126. In such implementations, the lower robot wrist mount 126 is able to rotate about a horizontal axis 130c. The wrist mount 126 may be caused to move between different positions in the YZ plane by rotating the various lower robot arm links 124 to cause the lower robot arm to extend or retract in the Y and Z directions; rotation of the wrist mount 126 may be performed in conjunction with such movements to keep the wrist mount 126 level during such movement.

In some implementations of the lower robot arm 120, two or more motors 328 may be used to control motion of the lower robot arm 120. FIG. 3-1 depicts the lower robot arm with multiple motors 328. The motors 328 may be located in the rotational joints 327, the lower robot arm links 124, the wrist mount 126, or elsewhere within the lower robot arm (there may be one or more motors fixedly mounted with respect to one of the lower robot arm links or rotational joints, or a belt-and-pulley drive system used that may allow one or more motors to be fixedly mounted with respect to the base plate 322, with the rotational input provided by such motor(s) being conveyed to the driven lower arm links via the belt-and-pulley system) and may be used to drive the motion of the lower robot. In some implementations, two or more encoders 329 may be used to determine relative rotational positioning of the various lower robot arm links. FIG. 3-1 depicts the lower robot arm 120 with multiple encoders 329. For example, an encoder 329, e.g., 329a and 329b, may be located at each location where two components in the robot arm linkage may be configured to rotate relative to one another and may be used to provide relative rotational orientation information on those components to the controller to allow the kinematic model of the lower robot arm to be updated.

The lower robot arm 120 may have a varying number of links, rotational joints, motors, and/or encoders in various configurations; it will be understood that such varied configurations of a lower robot arm are within the scope of this disclosure as well. Some alternative implementations may feature a lower robot arm in which the arm links are alternatively or additionally configured to rotate relative to each other about vertically oriented rotational axes (similar to the arm links in the wafer handling robot); in such implementations, the wrist joint may include mechanisms to permit rotation of the wrist mount relative to the closest adjacent arm link about both a vertically oriented rotational axis and also a horizontal rotational axis While the above discussion has focused on an implementation in which the wafer handling robot is provided with pitch capability by virtue of being mounted on a lower robot arm with a wrist mount, other implementations may provide pitch capability to a wafer handling robot using, for example, a gimbal mount that supports the wafer handling robot base. As noted earlier, FIG. 4 shows an example of a wafer handling robot 400 that includes a gimbal mount. The wafer handling robot arm 102 is attached to the mechanism 404. In the implementation shown, the mechanism 404 is a gimbal 432. The gimbal 432 may attach to the base 108 of the wafer handling robot arm 102 and may allow for rotation of the wafer handling robot arm 102 about at least the X and/or Y axes.

Generally speaking, the wafer handling robot 100 may include a controller 106 (see FIG. 1), which may include one or more processors 134 and one or more memory devices 136. The one or more processors 134, the one or more memory devices 136, and the various motors and encoders or other sensors of the wafer handling robot may be operably connected with each other, e.g., such that the one or more processors may cause the various motors of the wafer handling robot to controllably activate and such that the one or more processors may receive sensor data from, for example, the tilt sensor, the encoders, and, optionally, other sensors of the wafer handling robot. The one or more memory devices 136 may store computer-executable instructions for controlling the one or more processors 134 to perform various functions or operations using the wafer handling robot, such as are described herein. The computer-executable instructions may include, for example, instructions for the one or more processors 134 to calibrate the tilt sensor, read data from the tilt sensor, and/or to cause the wafer handling robot to move, e.g., as set forth in discussions herein regarding various techniques that may be implemented using a tilt sensor-equipped wafer handling robot.

Wafers transported by wafer handling robots are generally kept level. For wafer handling robots with blade-type end effectors, the end effector is typically kept in an orientation in which the surface of the wafer contacted by the end effector of the wafer handling robot, the contact plane, is generally level or horizontal, i.e., the surface of the wafer perpendicular to the direction of the earth's gravitational field at that location. This may reduce the possibility that the wafer might slide off of the end effector and also reduces the vertical clearance envelope needed to allow the wafer to be passed through various apertures, e.g., the load ports into processing chambers. FIG. 5-1 depicts a wafer handling robot 100 where a contact plane 560 is horizontal. FIG. 5-2 depicts the wafer handling robot 100 where the contact plane 560 has a pitch angle 546. The pitch angle 546 is the angle between a chosen surface of the wafer handling robot arm 102, e.g., a surface parallel to the contact plane 560, and the roll axis 548, an axis which is on a horizontal plane and perpendicular to the axis of rotation of the wrist mount. Typical wafer handling robots rely on a control system that utilizes a kinematic model and encoders to determine position and control movement of the wafer handling robot, as discussed previously, to ensure the contact plane 560 is horizontal. However, the kinematic model and encoders may not be able to take into account potential issues e.g., manufacturing tolerance issues, tolerance stack-up, rotational slop, and deflection, that may affect the actual placement of a given robot arm link. This may lead to the wafer handling robot moving so that the control system, based on the kinematic model, determines that the contact plane 560 is horizontal, as depicted in 5-1, while in reality, the end effector is at an orientation in which the contact plane 560 has the pitch angle 546, as depicted in 5-2. The pitch angle 546 may be so large that the wafer may slip off of the end effector, although a more likely outcome is that the wafer may not meet the vertical clearance envelopes needed for the wafer to pass through one or more apertures in the processing tool. In typical wafer handling robots, there is no built-in feedback mechanism that alerts the controller of the true pitch angle 546.

Returning to FIG. 2-2, a tilt sensor 216 may be used to sense the true pitch angle of the wafer handling robot arm 102, i.e., the pitch angle of a reference plane that is fixed with respect to some component of the wafer handling robot arm 102 relative to the earth's gravitational field. The tilt sensor 216 may allow the wafer handling robot 100 to calibrate levelness regardless of any misalignment in the mechanism, to determine levelness as a secondary check to the encoder-based control system and avoid relying only on a kinematic model and encoder data, which may be susceptible to tolerance stack-up issues, rotational slop, deflection of parts, etc. The tilt sensor 216 is a gravitational field sensor. Gravitational field sensors are sensors which use the acceleration from Earth's gravity to determine the orientation of the sensor (and thus of a component that the tilt sensor is fixedly mounted with respect to) relative to the Earth's gravitational field. Some examples of gravitational field sensors are accelerometers or inclinometers.

Figure 6:
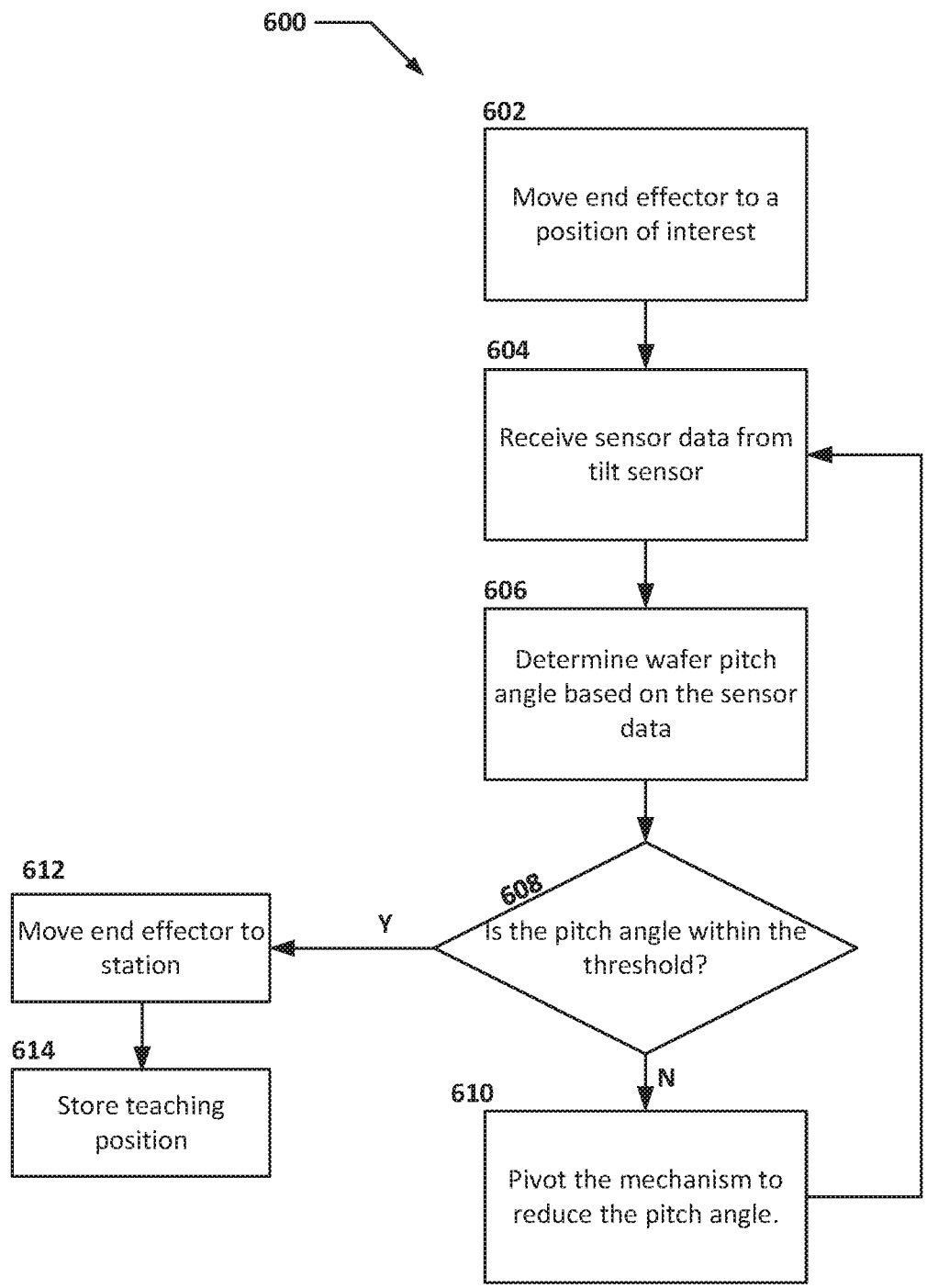
FIG. 6 depicts a flow diagram for a technique for teaching a wafer handling robot having a tilt sensor.

FIG. 6 shows a flow diagram for teaching a wafer handling robot such as those discussed herein, various robot arm positions that are selected, based on data from the level sensor, so as to cause a wafer supported by the wafer handling robot to be within acceptable levelness limits. In block 602, the controller may cause the end effector of the wafer handling robot, which may have previously had a wafer loaded onto an end effector thereof, to move to a particular position of interest, e.g., near a wafer station of a semiconductor processing tool (the wafer may optionally be omitted, but the most accurate loading of the wafer handling robot in terms of replicating normal use of the wafer handling robot may include the weight of the wafer as well). In block 604, the controller may receive sensor data from a tilt sensor of the wafer handling robot, e.g., a tilt sensor such as those discussed above. In block 606, the controller may determine the pitch angle of the component to which the tilt sensor is fixedly mounted and relative to a frame of reference defined by the earth's gravitational field based on the sensor data from the tilt sensor (such data may, in some implementations, be adjusted to account for calibration settings that may correct any misalignment between a reference frame of the tilt sensor and a reference frame of the component of the wafer handling robot to which the tilt sensor is fixedly mounted). An example of a pitch angle is depicted in FIG. 5-2, which shows the wafer handling robot arm 102 tilted upwards with a pitch angle 546. The pitch angle 546 is the angle between a chosen plane of the wafer handling robot arm 102, e.g., a plane, in this example, that is parallel to the contact plane 560, and the roll axis 548.

Returning to FIG. 6, in block 608, the controller may compare the pitch angle obtained from the tilt sensor to a threshold pitch angle (which may be a threshold pitch angle range, e.g., ±0.1° from horizontal, ±0.05° from horizontal, ±0.025° from horizontal, ±0.015° from horizontal, ±0.010° from horizontal, ±0.005° from horizontal, or any values in between these values). The threshold pitch angle is the maximum amount of angular tilt the chosen plane is from horizontal plane that is deemed acceptable for wafer handling, e.g., placing a wafer into a wafer station, picking a wafer from a wafer station, or transporting a wafer between stations or other locations. If the pitch angle exceeds the threshold pitch angle, the technique may proceed to block 610. In block 610, the controller may cause the mechanism to pivot so that the pitch angle is reduced. After the mechanism is caused to pivot, the controller may return to block 604 to receive further sensor data from the tilt sensor. The controller may continue to iterate through block 604 through 610 so long as the pitch angle exceeds the threshold pitch angle. If the pitch angle is within the threshold pitch angle, the controller may proceed from block 608 to 612.

In block 612, when the pitch angle is within the threshold pitch angle, the controller may cause the end effector of the wafer handling robot to move to a wafer station near the position of interest where the wafer handling robot will be taught a precise position for the wafer handling robot to pick and place wafers for a particular station. The wafer handling robot may be guided to the precise position, which may be called a "teaching position" of the wafer handling robot. There may be various methods to guide the wafer handling robot to the X, Y and Z coordinates of the teaching position. These methods may include manual movement of the end effector within the wafer station. For example, an operator may manually move the wafer handling robot to the teaching position by utilizing one or more fixtures that may interface with features of the wafer handling robot end effector that serves as a reference point and with another feature that is fixed with respect to the wafer station. Another method may be an automated method, where the wafer handling robot may use tools such as an active wafer centering (AWC) system, a calibration wafer, or combination thereof. For example, in a typical AWC configuration, multiple optical AWC sensors and optical beam emitters are positioned near a wafer station in fixed locations such that a semiconductor wafer, when passed into the wafer station, travels through two or more of the optical beams emitted by the optical beam emitters. The AWC sensors may detect when each optical beam encounters an edge of a semiconductor wafer, allowing the system to determine a reference point, e.g., a point that is nominally centered on the semiconductor wafer (this may only be an estimated or desired center location, as the exact placement of the semiconductor wafer on the end effector may not be known), on the end effector of the wafer handling robot. When a semiconductor wafer passes through the two or more of the optical beams emitted, the AWC may determine the location of the reference relative to the wafer station and may use the information to cause the end effector to move to the X and Y coordinates of the teaching position.

It will be understood that the portions of the wafer handling robot that are adjusted in order to obtain a desired degree of levelness may, during the manual or automated teaching of a station to the wafer handling robot arm, e.g., the wafer handling robot arm 102, be kept stationary. Thus, the wafer handling robot, including the mechanism (such as a lower robot arm 120) and the wafer handling robot arm 102 may be first caused to move to the position of interest prior to leveling. In some implementations, the position of interest may be a position from which the wafer handling robot arm 102 may be able to place or pick wafers from a wafer station associated with that position of interest without requiring further movement of the mechanism. The wafer handling robot arm 102 may then be subjected to leveling by adjusting the mechanism 104. After such leveling has been achieved, the mechanism 104 may be kept stationary while the wafer handling robot arm 102 is actuated or otherwise caused to move to the desired teaching position, e.g., the position that the wafer handling robot arm 102 would be in when placing or picking a wafer on or from the wafer station associated with that position of interest. Once the wafer handling robot arm 102 is in the teaching position, the positioning of the wafer handling robot arm 102 and the mechanism 104 may be stored as the "teaching position" for the wafer handling robot for that wafer station. The storage of the teaching position may be done after the wafer handling robot arm 102 is placed in the final teaching position, or in different phases, e.g., once a desired degree of levelness is achieved using the mechanism, data for the teaching position relating to the mechanism position may be stored, and further data relating to the wafer handling robot arm 102 position may be stored after that once the wafer handling robot arm 102 is in the final teaching position.

This process may be repeated for multiple wafer stations and positions of interest, commensurate with the number of wafer stations that must be "taught" to the wafer handling robot.

In block 614, the controller may store the current positions of the various wafer handling robot's components as a "teaching position" of the wafer handling robot in a memory device, e.g., such as one of the one or more memory devices of the controller. The teaching position may be values in the encoders of the wafer handling robot that are associated with the particular position of interest of the wafer handling robot, e.g., in this case, the teaching position represents a configuration of the wafer handling robot in which a wafer transported by the wafer handling robot would be considered acceptably level. When the wafer handling robot may move to the particular position of interest, the controller may cause the wafer handling robot to move so that the values provided by the encoders are caused to converge on the stored values associated with the particular position of interest. Such teaching may be performed in association with a variety of wafer handling robot positions. For example, if there are four general positions that the lower robot arm 120 may be in during wafer placement operations, then it may be desirable to perform such wafer levelness teaching for each such position (and possible additional ones, e.g., if the wafer handling robot arm 102 is extended to different amounts and/or directions at each such position). Thus, the appropriate teaching position may be used to control the robot depending on to which position the wafer handling robot is to be moved.

In some implementations, the technique of teaching various robot arm positions that are selected so as to cause a wafer supported by the wafer handling robot to be within acceptable levelness limits, as diagramed in FIG. 6, may be used in real time to actively level the wafer supported by the wafer handling robot during normal wafer handling operations. For example, the controller may cause the wafer handling robot to move the end effector to a position of interest, receive sensor data from the tilt sensor, determine a wafer pitch angle based on the sensor data, and compare the pitch angle to a threshold pitch angle. If the pitch angle is outside the threshold pitch angle, the controller may cause the mechanism to pivot so that the pitch angle is reduced. If the pitch angle is within the threshold pitch angle, the controller may cause the wafer handling robot to continue with its operation, e.g., placing a wafer at a wafer station.

This technique may be used to continuously actively level the wafer handling robot throughout its motion or may be used to actively level the wafer handling robot at positions of interest. A key difference between this method and the "teaching" method is that in the "teaching" method, the tilt sensor may be used to determine what encoder values represent a suitably "level" configuration, and during normal wafer transport operations the levelness will be achieved through the usual encoder-based, kinematic model-driven approach. In the latter case, the encoders may be still be used to generally place the arm in the desired configuration, but the tilt sensor output may then be used to fine-tune the wafer-handling robot position to ensure that the wafer transported thereby is acceptably level.

In some implementations, the technique of teaching various robot arm position that are selected so as to cause a wafer supported by the wafer handling robot to be within acceptable levelness limits, as discussed above with respect to FIG. 6, may be used periodically to validate and/or correct earlier teaching positions, e.g., to account for potential drift or other changes in the wafer handling robot. For example, a controller may be configured to use the technique of teaching various robot arm positions at various intervals during the operation of a semiconductor processing tool, e.g., on a time-based schedule, on a wafer or placement-based schedule (e.g., every 250 wafer placements or 200 wafers processed), of the user's choosing. In some implementations, the controller may be programmed to check a taught position using the teaching technique at various designated periodic times. If at the periodic check, the pitch angle initially is outside of the threshold pitch angle, the controller may cause the mechanism enter the teaching mode to pivot so that the pitch angle is reduced. The controller may cause the wafer handling robot to continue with the teaching process until the pitch angle is within the threshold pitch angle. Once the pitch angle is within the threshold pitch angle, the controller may store the values of the encoders associated with the position in the memory as an updated teaching position. If at the check, the pitch angle initially is within the threshold pitch angle, the controller may cause the wafer handling robot to continue with its operation, e.g., placing a wafer at a wafer station using the old teaching position. The user may choose the designated period. The designated period may be a function of a specified event, e.g., every time the wafer handling robot is turned on, after the wafer handling robot experiences an error, after a designed number of picks/places by the wafer handling robot, etc. The designated period may be a function of time, e.g., once a day, once a week, once a month, etc.

Figure 7:
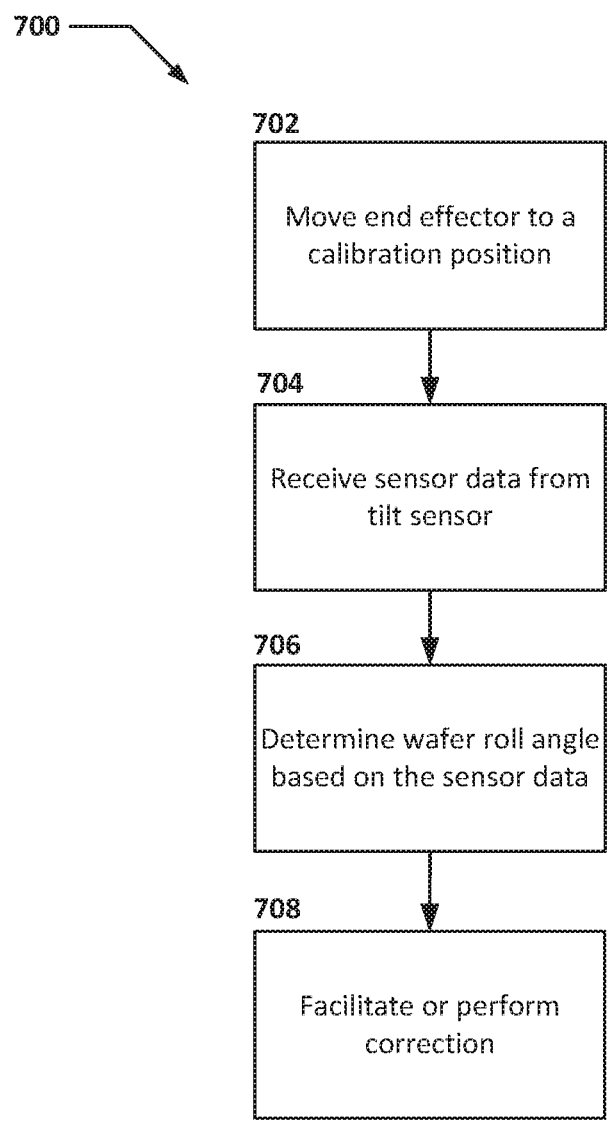
FIG. 7 depicts a flow diagram for a technique for calibrating a tilt sensor of a wafer handling robot.

The sensor may also be used to level a roll angle of a wafer handling robot. The roll angle is the angle between a chosen plane of the wafer handling robot arm 102 and a pitch axis. The pitch axis is an axis that is on the horizontal plane and perpendicular to the roll axis which was discussed above. FIG. 7 depicts a flow diagram for leveling the roll angle of a wafer handling robot to be within acceptable levelness limits. In block 702, the controller may cause the end effector to move to a calibration position, a position that will allow the roll angle of the wafer handling robot associated with that position to be determined. In block 704, the controller may receive sensor data from the tilt sensor, e.g., a tilt sensor such as those discussed above. In block 706, the controller may determine the roll angle from the sensor data from the tilt sensor (such data may, in some implementations, be adjusted to account for calibration settings that may correct any misalignment between a reference frame of the tilt sensor and a reference frame of the component of the wafer handling robot to which the tilt sensor is fixedly mounted). In block 708, corrective action may be taken to bring the roll angle within acceptable limits, e.g., within angular limits similar to those noted earlier with respect to acceptable pitch angle limits. In the embodiment shown in FIG. 1, for example, the lower mechanism 104 is a lower robot arm 120 that does not have any active ability to pivot about a roll axis. However, there may still be manual adjustment features, e.g., set screws or other finely adjustable mechanisms, that may be used by an operator to eliminate or mitigate such roll behavior so that the roll angle is within acceptable limits. In such embodiments, the controller may be able to continually give feedback of the roll angle to the operator to allow the manual adjustment to be performed. The manual adjustment may include adjusting set screw, shimming between mating parts, tightening or loosening screws, or a combination thereof. In other implementations, an actuator may be configured to provide for rotational adjustment of the wafer handling robot (or a portion thereof) about a roll axis, and the controller may control such an actuator to cause the wafer handling robot, or at least the portion thereof that includes the tilt sensor, to be rotated about the roll axis to bring the roll angle within acceptable limits.

In some implementations, the tilt sensor 216 may be calibrated to determine the orientation of the tilt sensor with respect to the element of the wafer handling robot arm to which it is fixedly mounted. In implementations where the tilt sensor is in the base 108, the orientation of the tilt sensor may optionally be calibrated to account for its orientation relative to the base. The tilt sensor may be fixedly mounted with respect to the base so that changes in the pitch angle of the tilt sensor match changes in the pitch angle of the base and changes of the roll angle of the tilt sensor match changes of the roll angle of the base. While such variants may be implemented so as to mount the tilt sensor in the base in a more-or-less pre-aligned configuration, e.g., with the tilt sensor positioned such that a vertical axis of a reference coordinate system of the tilt sensor is parallel to the rotational axis of one of the wafer handling robot arm rotational joints, some misalignment may still exist. In other implementations, no such pre-alignment may be performed, and the tilt sensor may be positioned and oriented within the base at any angle. Regardless of how the tilt sensor is mounted to the base, the tilt sensor may be calibrated after it is mounted to determine calibration settings for the tilt sensor that account for any misalignment between the tilt sensor and a particular frame of reference of the base, e.g., a frame of reference that has an axis aligned with the rotational axis of the rotational joint that joins the arm link(s) to the base. Such calibration may be performed by positioning the base in a fixture that is arranged to position the reference frame of the base in a particular desired orientation relative to the earth's gravitational field (or allow the positioning and orientation of the base to be adjusted to achieve such an orientation) and then obtaining measurements of what the tilt sensor reports out as the orientation of the base when the base is so positioned. These measurements, which may include one or more angular measurements, may then be used to adjust later measurements using the tilt sensor so as to transform those measurements into values indicative of the absolute orientation (with respect to the earth's gravitational field) of the base.

In some implementations, such as the implementation shown in FIG. 2-2, the tilt sensor 216 may be placed in a wafer handling robot arm link 110. Where the tilt sensor 216 is fixedly mounted to the wafer handling robot arm link, the orientation of the tilt sensor may need to be calibrated to match the orientation of the wafer handling robot arm link. The tilt sensor may be fixedly mounted with respect to the wafer handling robot arm link so that changes in the pitch angle of the tilt sensor match changes in the pitch angle of the wafer handling robot arm link and changes of the roll angle of the tilt sensor match changes of the roll angle of the wafer handling robot arm link. While such variants may be implemented so as to mount the tilt sensor in the wafer handling robot arm in a more-or-less pre-aligned configuration, e.g. with the tilt sensor position such that a vertical axis of a reference coordinate system of the tilt sensor is parallel to the rotational axis of one of the wafer handling robot arm joints, some misalign may still exist. In other implementations, no pre-alignment may be performed, and the tilt sensor may be position and oriented with the wafer handling robot arm at any angle. Regardless of how the tilt sensor is mounted to the wafer handling robot arm, the tilt sensor may be calibrated after it is mounted to determine calibration settings for the tilt sensor that account for any misalignment between the tilt sensor and a particular frame of reference of the wafer handling robot arm, e.g., a frame of reference that has an axis aligned with the rotational axis of the rotational joint that joins the arm link(s) to the base. Such a calibration technique is discussed below.

Figure 9:
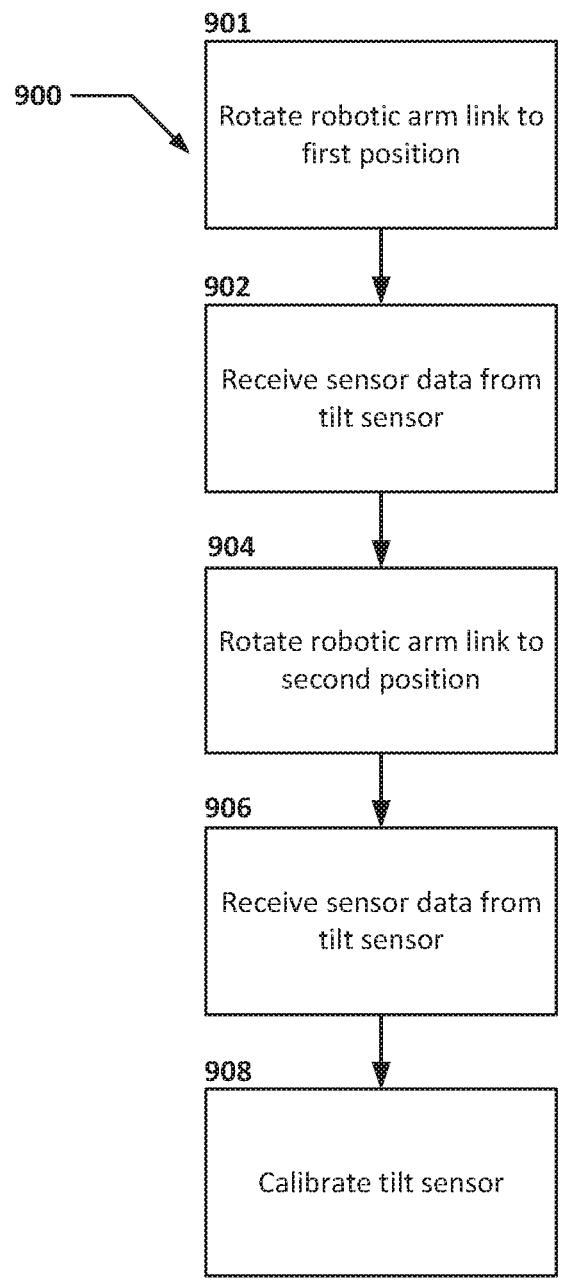
FIG. 9 depicts a flow diagram of a calibration technique for a tilt-sensor equipped wafer handling robot.

FIGS. 8-1 through 8-3 depict an example of a tilt sensor 216 in a wafer handling robot arm link 110a. When the tilt sensor 216 is placed in the wafer handling robot arm link 110a, similar issues may present themselves as for tilt sensors placed in the base, e.g., the frame of reference for the tilt sensor may not be aligned with the frame of reference of the wafer handling robot arm link 110a. To correct for such possible misalignment, a calibration routine may be performed to find the tilt sensor orientation relative to the wafer handling robot arm link orientation. FIG. 900 shows a flow diagram of such a calibration routine. In block 901, a controller may cause the wafer handling robot arm link to which the sensor is fixedly mounted with respect to rotate around the rotational axis of the rotational joint that supports it to a first position. In block 902, the controller may receive data from the tilt sensor. The data from the tilt sensor may be the pitch and roll angles acquired while the wafer handling robot arm link to which the tilt sensor is fixedly mounted is at the first position. In block 904, the controller may cause the wafer handling robot arm link to which the tilt sensor is fixedly mounted with respect to rotate around the rotational axis of the rotational joint that supports it to a second position; all other aspects of the wafer handling robot may be kept stationary (or at least those portions of the wafer handling robot between the wafer handling robot arm link and the base 108) so that the only rotation experienced by the tilt sensor is the rotation about this rotational axis. For example, in FIG. 8-1, the tilt sensor 216 is fixedly mounted with respect to the wafer handling robot arm link 110a, and the controller may cause the wafer handling robot arm link 110a to rotate about the axis 118a. In FIG. 8-1, the robot arm link is in the first position. FIG. 8-2 shows the wafer handling robot arm link 110a after it has rotated relative to the base 108 and about axis 118a to the secondary position. In one embodiment, the robot arm link may, as depicted in FIGS. 8-1 and 8-2, rotate relative to the base by 180° about the axis 118a from the first or initial position to the secondary position. Moving back to the flow diagram of the calibration routine in FIG. 9, in block 906, the controller may receive further data from the tilt sensor. The data from the tilt sensor may be the pitch and roll angles acquired while the wafer handling robot arm link is in the secondary position. In block 908, the controller may calibrate the tilt sensor. The calibration routine may be used to transform the tilt sensor's pitch and roll measurements into a coordinate system of the wafer handling robot arm link (from the sensor's reference frame to the robot arm link's reference frame). To do this, the controller may use both the pitch and roll angles from the tilt sensor in the initial position and the pitch and roll angles from the tilt sensor in the secondary position to determine the relative pitch and roll angles of the tilt sensor to the wafer handling robot arm link.

FIGS. 10-1 and 10-2 depict an example of the wafer handling robot 100 with different reference frames and in the first position or the second position; the different reference frame include a sensor reference frame 1054, a wafer handling robot arm link reference frame 1052 (an "arm" reference frame), and a fixed reference frame 150 (a "world" reference frame). The calibration routine may be used to determine the sensor reference frame 1054 relative to the wafer handling robot arm link reference frame 1052. Both the sensor reference frame 1054 and the wafer handling robot arm link reference frame 1052 may have orientations relative to the fixed reference frame 150 that are unknown prior to calibration; the fixed reference frame 150 may, for example, be oriented with its vertical axis (z) aligned with the vertical axis of relative to the earth's gravitational field. The tilt sensor 216 is able to determine the sensor's pitch and roll relative to the fixed reference frame 150.

The calibration by the controller in block 908 uses the tilt sensor's pitch ($\vartheta$) and roll ($\varphi$) angles at the initial position and the tilt sensor's pitch ($\vartheta'$) and roll ($\varphi'$) angle at the secondary position, in combination with the amount of rotation experienced by the tilt sensor about the rotational axis during the transition of the arm link from the initial position to the second position. In this example, the secondary position is a 180° angular rotation about a link rotational axis 1018 from the initial position. The link rotational axis is parallel to a Z direction of the wafer handling robot arm link reference frame 1052. The orientation of both the wafer handling robot arm link reference frame 1052 and the link rotational axis 1018 may be unknown. The link rotational axis 1018 orientation may be expressed as n̂, which is a unit vector that may be expressed in terms of $n_1$, $n_2$, and $n_3$ which are the x, y, and z components respectively.

The four values received ($\vartheta$, $\varphi$, $\vartheta'$, $\varphi'$) from the tilt sensor are the tilt sensor's absolute orientation in reference to the fixed reference frame 150, both before and after the rotation of the tilt sensor about the axis 1018. The sensor reference frame 1054 may be determined by using the tilt sensor's pitch and roll angles at the initial position and the secondary position. The absolute orientation of the sensor reference frame 1054 may be determined by multiplying rotation matrices. For example, the absolute orientation of the sensor reference frame 1054 relative to the fixed reference frame 150 while the wafer handling robot arm link 110 is in the initial position may be determined according to:

$$[R_y](\theta) * [R_x](\varphi)$$

where $[R_y]$ is the rotation of the sensor around the Y axis of the fixed reference frame 150 and $[R_x]$ is the rotation of the sensor around the X axis of the fixed reference frame 150. The absolute orientation of the tilt sensor reference frame 1054 relative to the fixed reference frame 150 while the wafer handling robot arm link 110 is in the secondary position may be determined according to:

$$[R_y](\theta') * [R_x](\varphi')$$

The secondary position is a 180° rotation about the link rotational axis 1018 from the initial position, and can be expressed by:

$$[R_n](180°)*[R_y](\theta)*[R_y](\varphi)=[R_y](\theta')*[R_x](\varphi')$$

where $[R_n]$ is the rotation of the sensor around the link rotational axis n̂. The orientation of the axis of rotation n̂ may be calculated from the above equation, which may be rewritten as:

$$\begin{pmatrix} 2n_1^2-1 & 2n_1n_2 & 2n_1n_3 \\ 2n_1n_2 & 2n_2^2-1 & 2n_2n_3 \\ 2n_1n_3 & 2n_2n_3 & 2n_3^2-1 \end{pmatrix} * \begin{pmatrix} \cos\theta & \sin\varphi\sin\theta & \cos\varphi\sin\theta \\ 0 & \cos\varphi & -\sin\varphi \\ -\sin\theta & \cos\theta\sin\varphi & \cos\theta\cos\varphi \end{pmatrix} = $$

$$\begin{pmatrix} \cos\theta' & \sin\varphi'\sin\theta' & \cos\varphi'\sin\theta' \\ 0 & \cos\varphi' & -\sin\varphi' \\ -\sin\theta' & \cos\theta'\sin\varphi' & \cos\theta'\cos\varphi' \end{pmatrix}$$

The controller may multiply the matrices on the left side of the equation and equate them to the components on the right. For example, the controller may equate components [3,1], [3,2], and may take into account that n̂ is a unit vector to get the following equations.

$$2n_1n_3 \cos\theta - (2n_3^2-1)\sin\theta = -\sin\theta'$$

$$2n_1n_3 \sin\varphi \sin\theta + 2n_2n_3 \cos\varphi + (2n_3^2-1)\cos\theta \sin\varphi + \cos\theta' \sin\varphi'$$

$$n_1^2 + n_2^2 + n_3^2 = 1$$

The controller, having three equations and three unknowns, may solve for the unit vector n̂, $n_1$, $n_2$, and $n_3$ in terms of $\vartheta$, $\phi$, $\vartheta'$, and $\phi'$.

The pitch and roll angles of the link reference frame 1052 can be solved for the pitch ($\vartheta_{link}$) and roll ($\varphi_{link}$) of the link reference frame 1052 relative to the fixed reference frame 150 according to the following relations:

$$\vartheta_{link} = \arctan\left(\frac{n_1}{n_2}\right)$$

$$\varphi_{link} = -\arcsin(n_2)$$

The tilt sensor's pitch ($\vartheta_{sensor}$) and roll ($\varphi_{sensor}$) offset angles relative to the link may be found using the initial pitch ($\vartheta$) and roll ($\phi$) angles relative to the fixed reference frame 150 and the pitch ($\vartheta_{link}$) and roll ($\varphi_{link}$) angles of the link reference frame 1052 relative to the fixed reference frame 150 and solving:

$$([R]_{link}^0)^T(\vartheta_{link}, \varphi_{link})*[R]_{sensor}^0(\vartheta, \varphi)=[R]_{sensor}^{link}(\vartheta_{sensor}, \varphi_{sensor})$$

where $[R]_{link}^0$ is the absolute rotation matrix of the link rotational axis 1018 relative to the fixed reference frame 150, $[R]_{sensor}^0$ is the absolute rotation matrix of the tilt sensor 216 relative to the fixed reference frame 150, and $[R]_{sensor}^{link}$ is the relative rotation matrix of the tilt sensor 216 relative to the link reference frame 1052.

In view of the above discussion, the controller may solve for the tilt sensor pitch offset ($\vartheta_{sensor}$) and roll offset ($\varphi_{sensor}$) angles relative the wafer handling robot arm link reference frame 1052 using the following relationships:

$$\vartheta_{sensor} = -\arcsin(-\cos\varphi_{link}\cos\vartheta_{link}\sin\varphi + \cos\varphi_{link}\cos\vartheta\sin\vartheta_{link})$$

$$\varphi_{sensor} = \arcsin\left(\frac{\cos\varphi_{link}\cos\vartheta\cos\vartheta_{link}\sin\varphi + \cos\varphi_{link}\sin\varphi\sin\vartheta\sin\vartheta_{link} - \cos\varphi\sin\varphi_{link}}{\cos(-\arcsin(-\cos\varphi_{link}\cos\vartheta_{link}\sin\vartheta + \cos\varphi_{link}\cos\vartheta\sin\vartheta_{link}))}\right)$$

Once these pitch and roll offset angles are determined, these values can be applied to any measurements of pitch and roll obtained using the tilt sensor going forward to obtain the pitch and roll values for the robot arm link to which the tilt sensor is affixed relative to the fixed reference frame 150 that are corrected for any potential misalignment between the coordinate systems of the tilt sensor and the arm link.

In some implementations, the controller for the wafer handling robot may be part of a system into which the above-described examples may be integrated. Such systems can comprise semiconductor processing equipment, including a processing tool or tools, chamber or chambers, a platform or platforms for processing, and/or specific processing components (a wafer handling robot, a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

It is to be understood that the phrases "for each <item> of the one or more <items>," "each <item> of the one or more <items>," or the like, if used herein, are inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items.

It is to be understood that the above disclosure, while focusing on a particular example implementation or implementations, is not limited to only the discussed example, but may also apply to similar variants and mechanisms as well, and such similar variants and mechanisms are also considered to be within the scope of this disclosure.

What is claimed is:

1. A wafer-handling apparatus, comprising:
   a first robot arm comprising:
      a base,
      a plurality of first robot arm links, and a tilt sensor configured to detect orientation relative to the Earth's gravitational field; and
   a mechanism supporting the first robot arm, wherein:
      at least one first robot arm link of the plurality of first robot arm links is an end effector that is configured to support a semiconductor wafer,
      one first robot arm link of the plurality of first robot arm links has an end rotatably connected to the base,
      the tilt sensor is connected to the base or to one first robot arm link of the plurality of first robot arm links that is not an end effector, and
      the mechanism is configured to pivot the first robot arm about a horizontal pitch axis in response to one or more inputs.

2. The wafer-handling apparatus of claim 1, wherein the mechanism comprises a gimbal that is configured to support the base of the first robot arm.

3. The wafer-handling apparatus of claim 1, wherein the mechanism is a second robot arm, the second robot arm having:
   one or more second robot arm links, and
   one or more second robot arm rotational joints, wherein:
      at least one of the one or more second robot arm rotational joints has a horizontal axis of rotation,
      each second robot arm link is rotatably connected with at least one of the other second robot arm links by one of the one or more second robot arm rotational joints, and
      the second robot arm is configured to support the base of the first robot arm.

4. The wafer-handling apparatus of claim 1, wherein the tilt sensor is an accelerometer.

5. The wafer-handling apparatus of claim 1, wherein the tilt sensor is an inclinometer.

6. The wafer-handling apparatus of claim 1, wherein the tilt sensor is fixedly mounted with respect to the base.

7. The wafer-handling apparatus of claim 1, wherein the tilt sensor is fixedly mounted with respect to an instrumented first robot arm link of the plurality of first robot arm links.

8. The wafer-handling apparatus of claim 7, wherein the instrumented first robot arm link is the first robot arm link that supports, directly or indirectly, each of the one or more other first robot arm links.

9. The wafer-handling apparatus of claim 8, wherein: the mechanism is a second robot arm, the second robot arm having:
   one or more second robot arm links, and
   one or more second robot arm rotational joints, wherein:
      at least one of the one or more second robot arm rotational joints has a horizontal axis of rotation,
      each second robot arm link is rotatably connected with at least one of the other second robot arm links by one of the one or more second robot arm rotational joints, and
      the second robot arm is configured to support the base of the first robot arm.

10. The wafer-handling apparatus of claim 7, wherein:
    there are three or more first robot arm links,
    the three or more first robot arm links include a proximal first robot arm link, a distal first robot arm link, and the instrumented first robot arm link, and
    the instrumented first robot arm link is rotatably connected with the proximal first robot arm link by a proximal first robot arm rotational joint at a first end and with the distal first robot arm link by a distal first robot arm rotational joint at a second end opposite the first end.

11. The wafer-handling apparatus of claim 7, further comprising:
a controller including one or more processors and one or more memory devices, wherein:
the one or more processors and the one or more memory devices are operatively connected,
the one or more processors are communicatively connected with the tilt sensor, and
the one or more memory devices store computer-executable instructions that, when executed by the one or more processors, cause the one or more processors to:
receive data generated by the tilt sensor while the instrumented first robot arm link is at a first angular position relative to the base,
cause the instrumented first robot arm link to rotate to a second angular position relative to the base,
receive data generated by the tilt sensor while the instrumented first robot arm link is at the second angular position, and
determine, based on the data received from the tilt sensor while the instrumented first robot arm link is in the first angular position relative to the base and the data received from the tilt sensor while the instrumented first robot arm link is in the second angular position relative to the base, calibration data for the tilt sensor.

12. The wafer-handling apparatus of claim 11, wherein the second angular position is 180° from the first angular position.

13. The wafer-handling apparatus of claim 11, wherein the one or more memory devices further store additional instructions that, when executed, cause the one or more processors to:
cause the end effector to be moved to a location associated with a wafer station;
receive sensor data generated by the tilt sensor while the end effector is at the location associated with the wafer station;
determine, based on the sensor data generated by the tilt sensor while the end effector is at the location associated with the wafer station, a pitch angle of the tilt sensor;
compare the pitch angle of the tilt sensor to a threshold pitch angle range;
cause, if the pitch angle of the tilt sensor is outside of the threshold pitch angle range, the mechanism to pivot about a horizontal pivot axis so that the pitch angle of the tilt sensor is within the threshold pitch angle range; and
store, in at least one memory device of the one or more memory devices, a teaching position of the mechanism and the first robot arm in association with the wafer station, wherein the teaching position is indicative of the positioning of the mechanism and the first robot arm while the end effector is at the location associated with the wafer station and the pitch angle of the tilt sensor is within the threshold pitch angle range.

14. The wafer-handling apparatus of claim 13, wherein the one or more memory devices further store additional instructions that, when executed, cause the one or more processors to determine the pitch angle at least partly based on the calibration data from the tilt sensor.

15. The wafer-handling apparatus of claim 13, wherein the one or more memory devices further store additional instructions that, when executed by the one or more processors, cause the one or more processors to cause the mechanism and the first robot arm to move to the teaching position when the first robot arm is caused to place a wafer at the wafer station.

16. The wafer-handling apparatus of claim 11, wherein the one or more memory devices further store additional instructions that, when executed, cause the one or more processors to:
cause the end effector to retrieve, and support, a wafer;
cause the end effector and the wafer supported thereby to be moved to a location associated with a wafer station;
receive sensor data generated by the tilt sensor while the end effector and the wafer supported thereby are at the location associated with the wafer station;
determine, based on the sensor data generated by the tilt sensor while the end effector is at the location associated with the wafer station, a pitch angle of the tilt sensor;
compare the pitch angle of the tilt sensor to a threshold pitch angle range;
cause, if the pitch angle of the tilt sensor is outside of the threshold pitch angle range, the mechanism to pivot the first robot arm about a horizontal pivot axis so that the pitch angle of the tilt sensor is within the threshold pitch angle range; and
cause the first robot arm to move the end effector to place the wafer in the wafer station after the pitch angle of the tilt sensor is within the threshold pitch angle range.

17. The wafer-handling apparatus of claim 16, wherein the one or more memory devices further store additional instructions that, when executed, cause the one or more processors to determine the pitch angle at least partly based on the calibration data from the tilt sensor.

18. The wafer-handling apparatus of claim 11, wherein the one or more memory devices further store additional instructions that, when executed, cause the one or more processors to:
cause the end effector to be moved to a location associated with a wafer station;
receive sensor data generated by the tilt sensor while the end effector is at the location associated with the wafer station;
determine, based on the sensor data generated by the tilt sensor while the end effector is at the location associated with the wafer station, a pitch angle of the tilt sensor and a roll angle of the tilt sensor;
compare the pitch angle of the tilt sensor to a threshold pitch angle range;
cause, if the pitch angle of the tilt sensor is outside of the threshold pitch angle range, the mechanism to pivot about a first horizontal pivot axis so that the pitch angle of the tilt sensor is within the threshold pitch angle range;
compare the roll angle of the tilt sensor to a threshold roll angle range;
cause, if the roll angle of the tilt sensor is outside of the threshold roll angle range, the mechanism to pivot about a second horizontal pivot axis so that the roll angle of the tilt sensor is within the threshold roll angle range, wherein the first and second horizontal pivot axes both lie in a horizontal plane and are orthogonal to one another; and
store, in at least one memory device of the one or more memory devices, a teaching position of the mechanism and the first robot arm in association with the wafer station, wherein the teaching position is indicative of the positioning of the mechanism and the first robot arm while the end effector is at the location associated with the wafer station, the pitch angle of the tilt sensor is within the threshold pitch angle range, and the roll angle of the tilt sensor is within the threshold roll angle range.

19. The wafer-handling apparatus of claim 11, wherein the one or more memory devices further store additional instructions that, when executed, cause the one or more processors to:
   cause the end effector to retrieve, and support, a wafer;
   cause the end effector and the wafer supported thereby to be moved to a location associated with a wafer station;
   receive sensor data generated by the tilt sensor while the end effector and the wafer supported thereby are at the location associated with the wafer station;
   determine, based on the sensor data generated by the tilt sensor while the end effector is at the location associated with the wafer station, a pitch angle of the tilt sensor and a roll angle of the tilt sensor;
   compare the pitch angle of the tilt sensor to a threshold pitch angle range;
   cause, if the pitch angle of the tilt sensor is outside of the threshold pitch angle range, the mechanism to pivot the first robot arm about a first horizontal pivot axis so that the pitch angle of the tilt sensor is within the threshold pitch angle range;
   compare the roll angle of the tilt sensor to a threshold roll angle range;
   cause, if the roll angle of the tilt sensor is outside of the threshold roll angle range, the mechanism to pivot the first robot arm about a second horizontal pivot axis so that the roll angle of the tilt sensor is within the threshold roll angle range, wherein the first and second pivot axes are both in a horizontal plane and orthogonal to one another; and
   cause the first robot arm to move the end effector to place the wafer in the wafer station after the pitch angle of the tilt sensor is within the threshold pitch angle range and the roll angle of the tilt sensor is within the threshold roll angle range.

20. The wafer-handling apparatus of claim 11, wherein the one or more memory devices further store additional instructions that, when executed, cause the one or more processors to:
   cause the end effector to be moved to a location associated with a wafer station;
   receive sensor data generated by the tilt sensor while the end effector is at the location associated with the wafer station;
   determine, based on the sensor data generated by the tilt sensor while the end effector is at the location associated with the wafer station, a roll angle of the tilt sensor; and
   cause an indication of the roll angle of the tilt sensor to be presented.

* * * * *